United States Patent [19]

Wile et al.

[11] Patent Number: 5,745,386
[45] Date of Patent: Apr. 28, 1998

[54] TIMING DIAGRAM METHOD FOR INPUTTING LOGIC DESIGN PARAMETERS TO BUILD A TESTCASE FOR THE LOGIC DIAGRAM

[75] Inventors: Bruce Wile, Poughkeepsie; Dean Gilbert Bair, Bloomington; Edward James Kaminski, Jr., Poughkeepsie, all of N.Y.

[73] Assignee: International Business Machines Corporation, Armonk, N.Y.

[21] Appl. No.: 533,128

[22] Filed: Sep. 25, 1995

[51] Int. Cl.⁶ ............................................. G06F 15/62
[52] U.S. Cl. .................................... 364/578; 364/490
[58] Field of Search ........................ 364/488, 489, 364/490, 491, 578; 395/500; 345/94, 134

[56] References Cited

U.S. PATENT DOCUMENTS

| | | | |
|---|---|---|---|
| 4,364,036 | 12/1982 | Shimizu | 340/715 |
| 4,554,536 | 11/1985 | Jackson | 340/747 |
| 4,914,568 | 4/1990 | Kodosky | 364/200 |
| 5,073,853 | 12/1991 | Johnson | 395/575 |
| 5,173,869 | 12/1992 | Sakamoto | 364/578 |
| 5,187,677 | 2/1993 | Kovalick | 364/721 |
| 5,210,837 | 5/1993 | Wiecek | 395/375 |
| 5,313,615 | 5/1994 | Newman | 395/500 |
| 5,371,851 | 12/1994 | Pieper | 395/164 |
| 5,375,125 | 12/1994 | Oshimitsu | 371/19 |
| 5,381,524 | 1/1995 | Lewis et al. | 395/161 |
| 5,384,720 | 1/1995 | Ku | 364/578 |
| 5,623,418 | 4/1997 | Rostoker et al. | 364/489 |

*Primary Examiner*—Kevin J. Teska
*Assistant Examiner*—A. S. Roberts
*Attorney, Agent, or Firm*—Lynn L. Augspurger; Laurence J. Marhoefer

[57] ABSTRACT

A. system (i.e. a tool set) provides logic verification at the logic design level in which an external stimulus to the design is derived from a series of generalized timing diagrams that obey the interface protocols of the logic design under test. A timing diagram editor provides a graphical user interface that allows the logic designer to describe his or her logic in a general timing diagram format incorporating permutations of the interface specification. The output of the timing diagram editor is a file that describes the interfaces of the logic; this file can contain multiple timing diagrams that describe different interface interactions. A suitable simulation driver reads the file created by the timing diagram editor, learns the interfaces described therein, and uses simulation randomization algorithms to drive the interfaces with legal scenarios for the interfaces described in the timing diagram.

13 Claims, 12 Drawing Sheets

TIMING DIAGRAM METHOD FOR INPUTTING LOGIC DESIGN PARAMETERS TO BUILD A TESTCASE FOR THE LOGIC DIAGRAM

BACKGROUND OF THE INVENTION

1. Field of the Invention

This invention relates to an improved method for constructing a testcase to verify logic at the logic design level, and more particularly to a timing diagram, graphical user interface for constructing such testcases.

2. Description of the Prior Art

The task of verification of a logic design, particularly the logic design of a portion of a large system, is often the responsibility of the logic designer. In the prior art, in order to attempt to verify a logic design, the logic designer was required to write a program to simulate the logic design or to design language testcases (referred to in the art as behaviorals).

These prior art approaches to logic design verification are deficient in at least two respects. If the task of verification is the responsibility of the logic designer, as it often is, the format of the program or testcase which the logic designer must write is often unfamiliar to him or her. Further, existing testcase tools are not capable of generating complex permutations of inputs to drive the logic.

A prior art system proven effective for verification of large simulation models is to surround the logic under test with so-called irritator behaviorals (i.e. random simulation driver inputs). However, with existing prior art technology, in order to verify a logic design with such a system, writing multiple random behavioral programs is required.

SUMMARY OF THE INVENTION

An object of this invention is the provision of a system for verifying logic designs which uses the concepts of irritator behaviorals but with a timing diagram input format, which is familiar to logic designers.

Another object of the invention is to use a simulation driver application to read a file created via a timing diagram user interface and generate therefrom a random simulation driver.

A further object of the invention is the provision of a user interface to simply describe the conditions that must exist for a timing diagram sequence to be legally initiated.

Briefly, this invention contemplates the provision of a system (i.e. a tool set) to provide logic verification at the logic design level in which an external stimulus to the design is derived from a series of generalized timing diagrams that obey the interface protocols of the logic design under test. A timing diagram editor provides a graphical user interface that allows the logic designer to describe his or her logic in a general timing diagram format incorporating permutations of the interface specification. The output of the timing diagram editor is a file that describes the interfaces of the logic; this file can contain multiple timing diagrams that describe different interface interactions. A suitable simulation driver reads the file created by the timing diagram editor, learns the interfaces described therein, and uses simulation randomization algorithms to drive the interfaces with legal scenarios for the interfaces described in the timing diagram. The timing diagram editor includes a timing diagram limitor that describes the conditions that must be true for a timing diagram sequence to be initiated. Each timing diagram has its own limitor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
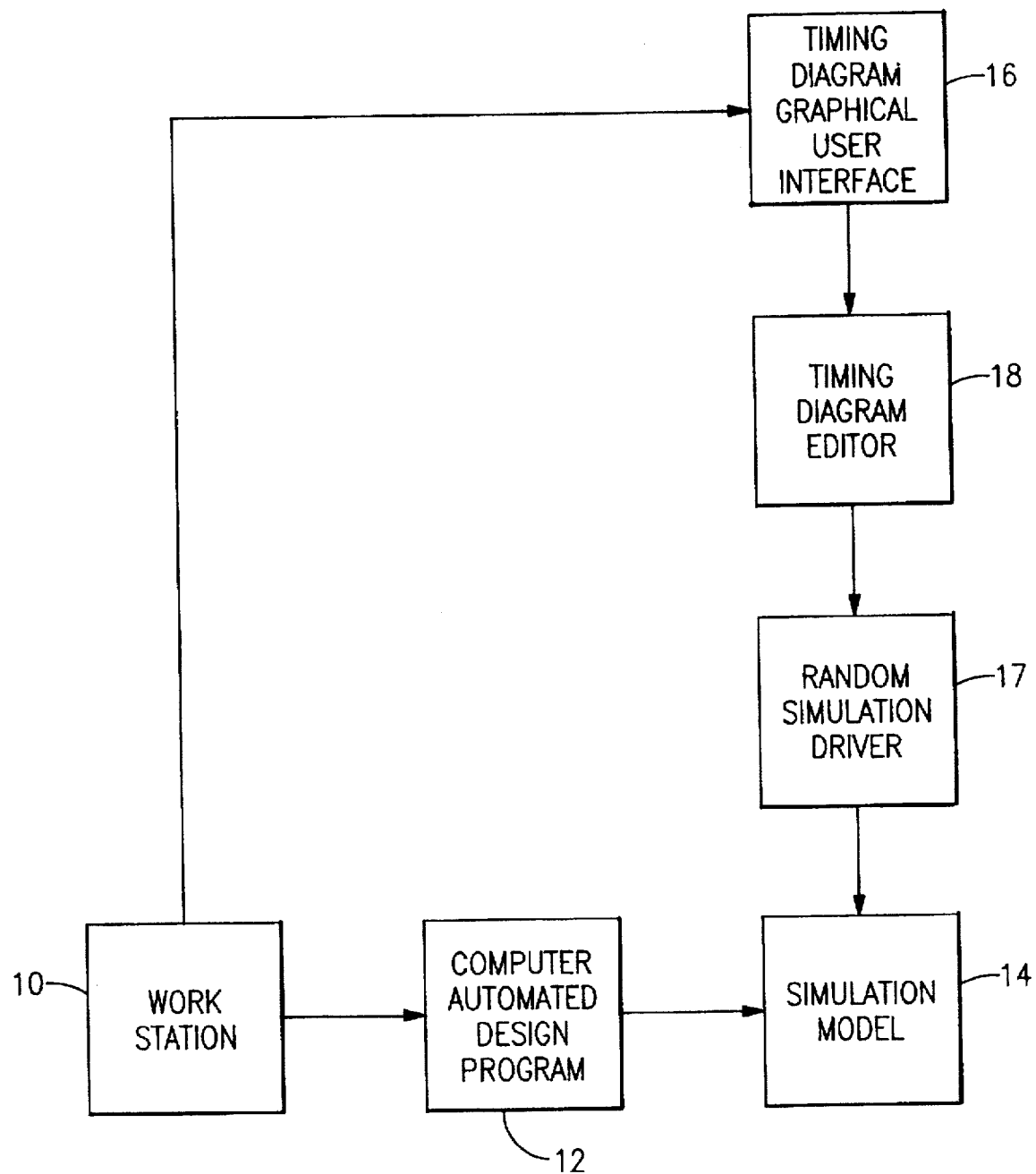
FIG. 1 is an overview flow diagram of the steps in building a testcase in accordance with the teachings of the invention.

Referring now to FIG. 1, a logic designer, via a work station 10, develops a logic design by means of a conventional computer automatic design program 12, such as the UHD hardware description application, which develops simulation model 14 of the logic. In accordance with the teaching of this invention, a user (e.g. a logic designer) lays out and/or edits a general interface protocol for his or her logic design in the form of timing diagrams. A timing diagram editor 18 takes the graphical user interface inputs and generates a file that describes the logic interfaces. This file can contain multiple timing diagrams that describe different interface interactions. A random simulation driver 17 reads the file, learns the interfaces described therein, and applies simulation randomization algorithms to drive the interfaces of the simulation model 16 with legal scenarios.

Figure 2:
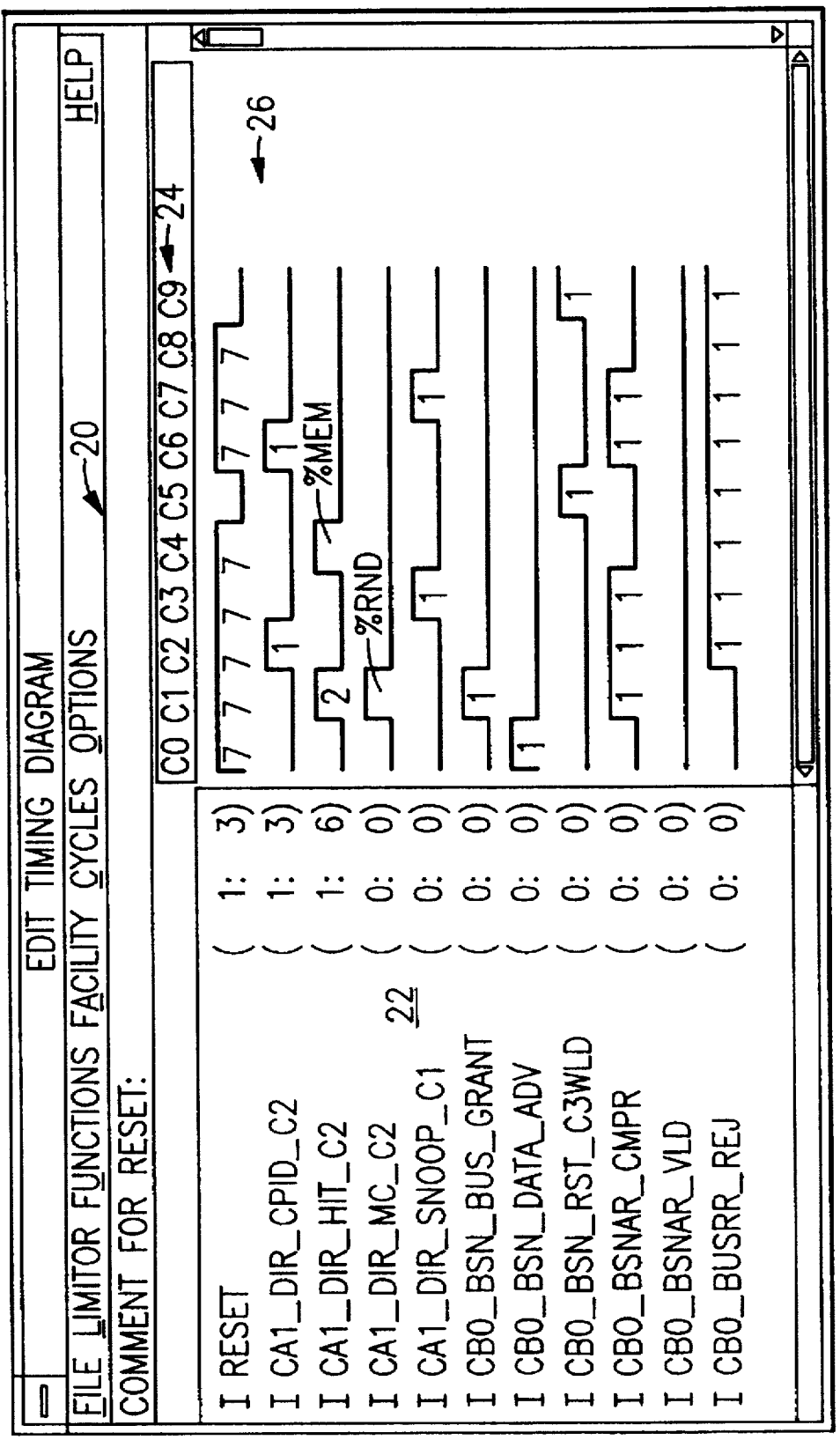
FIG. 2 illustrates one embodiment of a timing diagram graphical user interface with an exemplary timing shown on the display screen.

Referring now to FIG. 2, it shows a graphical user interface screen in accordance with the teachings of the invention, indicated by the general reference number 20. The screen presents the user with a matrix of facilities versus cycles. As used herein, a facility is any signal or bus existing in the logic design. Via the interface, facilities can be referenced, driven (e.g. to a set value), or checked (i.e. compared to a predicted value) during the simulation run. The size of the matrix is dependent upon how many facilities there are and how many cycles are needed to represent the interface. Key areas of the graphical user interface 20 are a facility description area 22, a cycle number area 24 and a value area 26.

Figure 3:
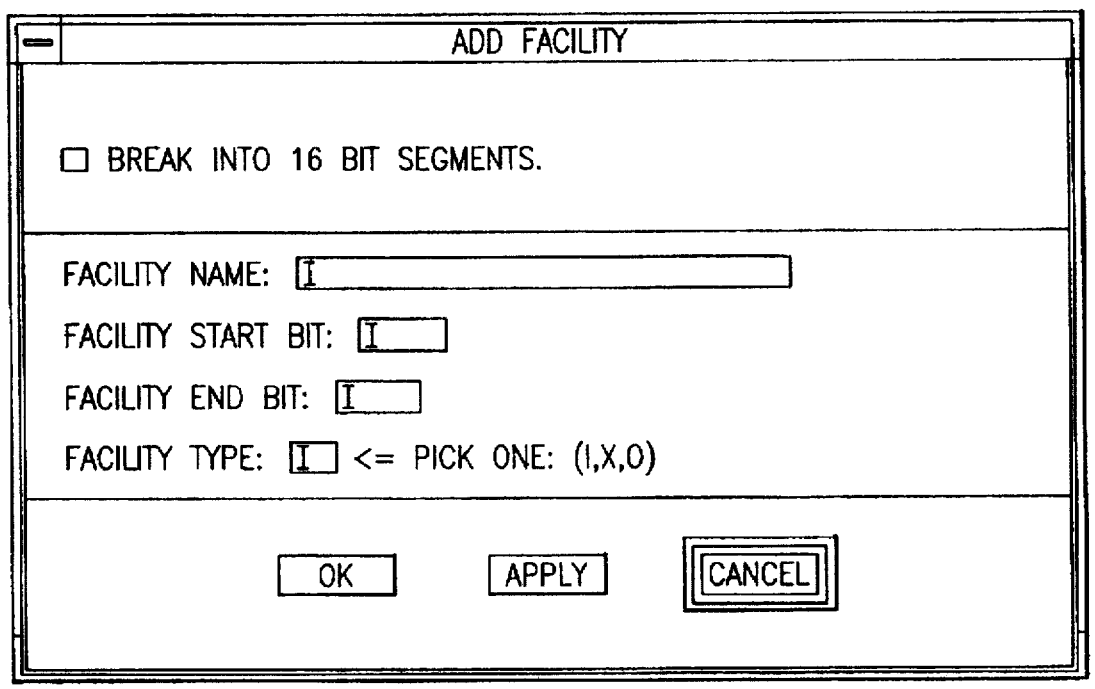
FIG. 3 is a facilities input interface screen for the graphical user interface of FIG. 2.

There are three fields in the facility description area 22. In these three fields all required information about each facility is inputted via a facility menu shown in FIG. 3. The first field in FIG. 2 is an input/output descriptor, which is one character in length. This input/output descriptor (e.g. I;O) designates the facility as either an input facility (I) or an output facility (O), and is entered adjacent the Facility Type in FIG. 3. The second field is the facility name, which is entered adjacent Facility Name in FIG. 3. The third field in the facility description area, is the bit range for the facility, which is entered via the Facility Start bit and Facility End bit lines in FIG. 3. Once the "OK" button is pressed in FIG. 3, the facility is added to the facility description area of FIG. 2.

The cycle number area of FIG. 2 is a heading field with labels for each cycle of the timing diagram. The labels go from C0 through Cn, where n is the last cycle in the timing diagram. A cycle input menu, FIG. 4, allows the user to add or delete cycles, copy cycle columns, and define recurring and looping cycles.

Figure 4:
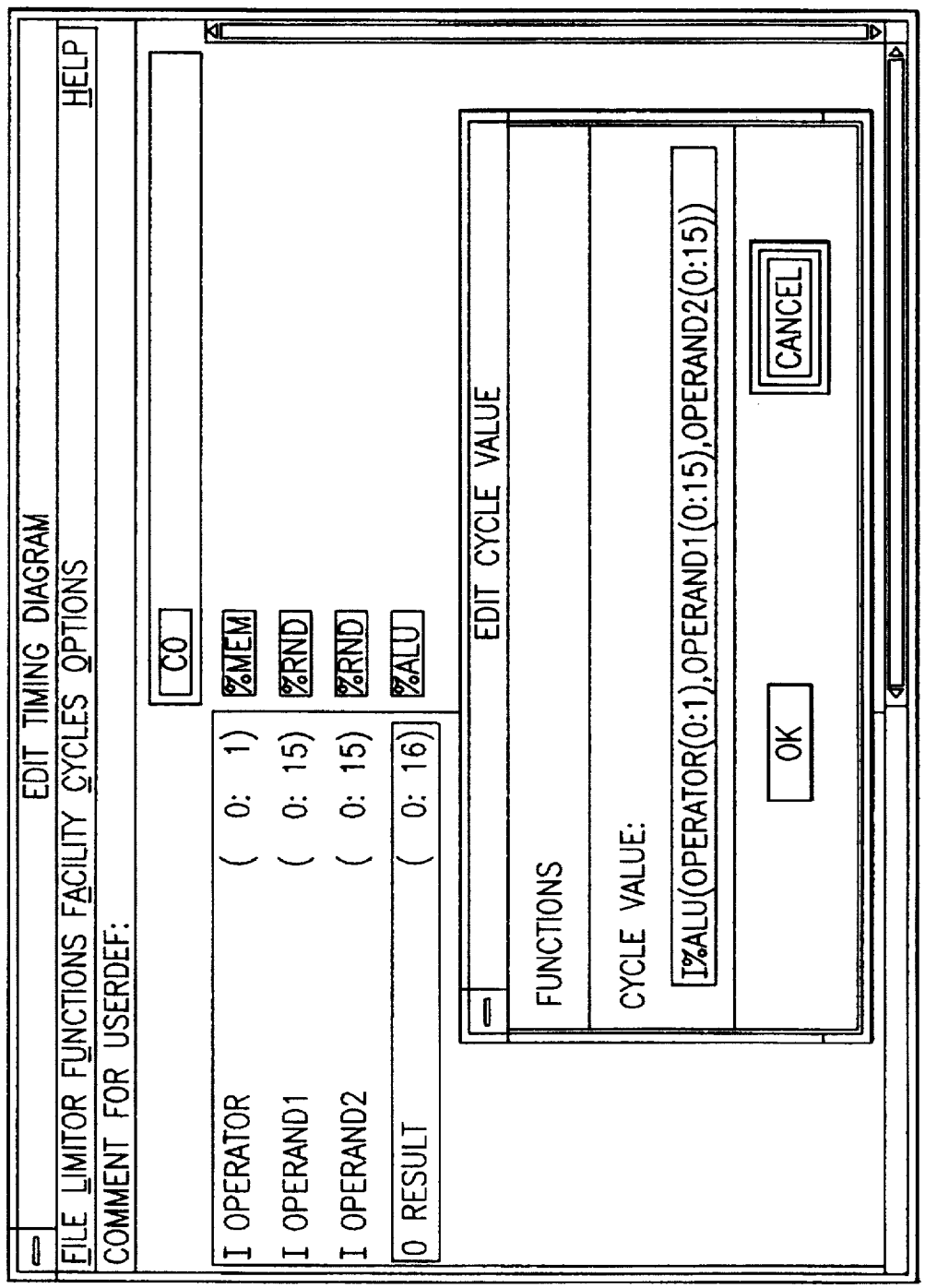
FIG. 4 is a cycle input interface screen for the graphical user interface of FIG. 2.

As illustrated in FIG. 4, selecting a cycle causes that cycle's entire column of values to be highlighted. A cycle is selected in order to add or delete cycles. Adding one cycle to a timing diagram is accomplished by using the "Add One Cycle" selection in the pull-down menu, FIG. 4. Adding one cycle will add an entire column of values to the value area, one value for each facility. Each facility's new value for the added cycle will be zero. The placement of a new cycle depends upon the selected cycle and the current insert option. If no cycle is selected when the "Add One Cycle" button is pressed, then the new cycle is added to the end of the timing diagram and becomes the last cycle. But if a cycle is selected, then the cycle will be inserted before or after the selected cycle, depending upon which insert options are chosen. Adding N cycles to the timing diagram works similarly to adding one cycle, except that there is a prompt for the number of cycles to be added. The "Add N Cycles" in the pull-down menu (FIG. 4) initiates the prompt. All new values for the added cycles are zero. The placement of additional cycles is the same as the placement of a single cycle. After adding new cycles, the cycle headings (C0 . . . Cn) in the cycle number area are automatically updated.

Deleting a cycle or cycles removes an entire cycle column (or columns) from the timing diagram. The pull-down menu provides an option "Delete Last Cycle" that allows simple deletion of the last cycle. To delete multiple contiguous cycles, the first cycle to be deleted is identified, and the "Delete N Cycles" from the pull-down menu provides a prompt for the number of cycles to be deleted starting with the selected cycle. After deletion, the cycle headings are automatically updated. The Copy Cycles option in the pull-down menu allows duplication of entire columns of values into new cycles. One or more contiguous cycles can be copied at once by selecting the first cycle to be copied then selecting the Copy Cycles option from the menu, which provides a prompt for the number of cycles to be copied and the destination cycle number for the new block of cycles.

Recurring cycles can be added to a timing diagram at any cycle except cycle C0. Recurring cycles represent a waiting or a looping state in the interface. If a waiting or looping state represents waiting for an event, such as returning data or a response, the recurring cycle will have two associated cycles; one representing the wait state and one representing the cycle in which the event has occurred. If the waiting or looping state is defined by some number of cycles, the recurring cycle will have just one looping state cycle associated with it.

To add a recurring cycle, the cycle where the recurring cycle is to be added is initially selected by selecting the cycle prior to or cycle after the cycle where the recurring cycle is to be added. To update an already existing recurring cycle, the recurring cycle to be updated is selected and the Update Recurring Cycle option is selected from the pull-down menu.

Figure 5:
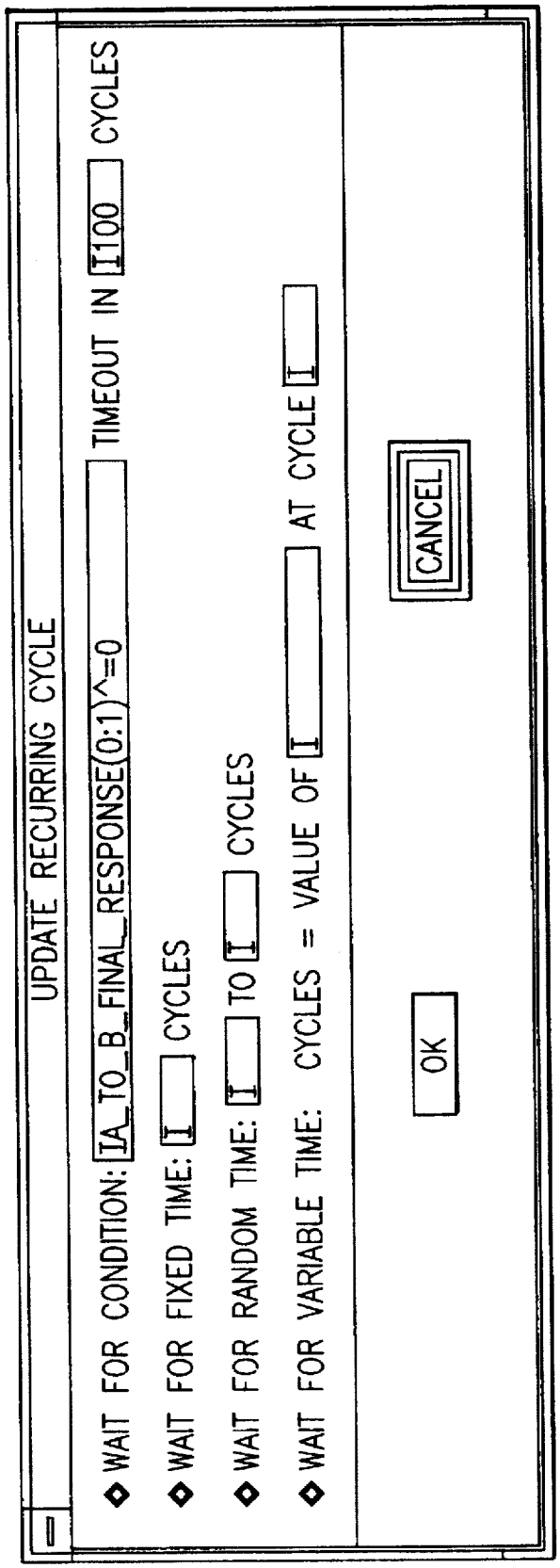
FIG. 5 is a recurring cycle input interface screen for the graphical user interface of FIG. 2.
Figure 6:
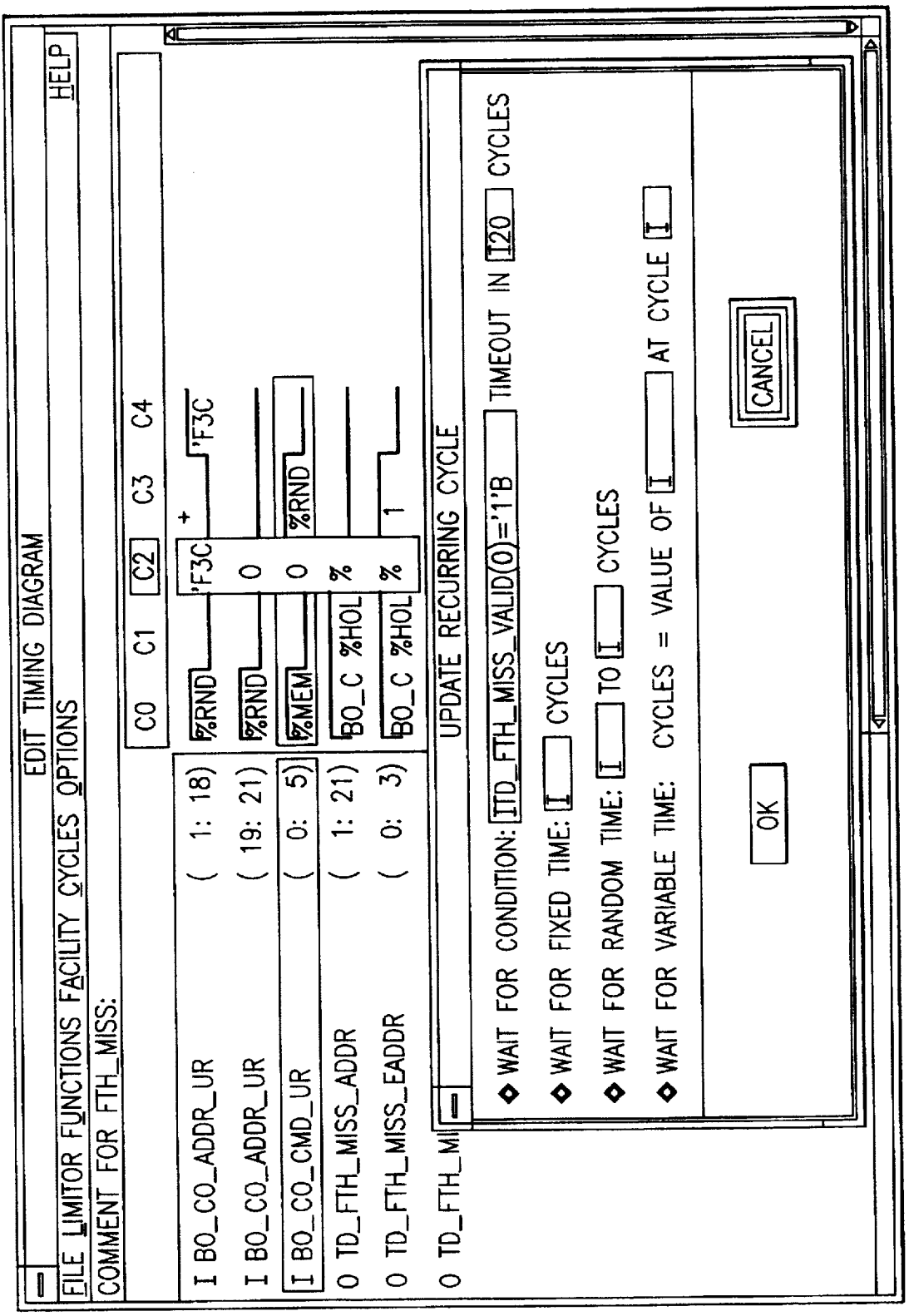
FIG. 6 is an illustration in part of the graphical user interface screen of FIG. 2, here depicting a novel presentation to the user of a recurring/looping cycle.

Referring now to FIG. 5, in defining a recurring cycle the end condition of the recurring cycle is specified. The end condition is set in the add or update recurring cycle screen, FIG. 5. Four types of end conditions are allowed. The first, "Wait for Condition" allows entry of a Boolean expression that states the end condition of the wait for event type of recurring cycle. For this type of end condition, an additional timeout value must be entered. The timeout value is used in the simulation to flag a hang condition. The remaining three types of end conditions allow specification of the numbers of cycles in a loop. This number can be a fixed number, a random range, or a variable number based upon the value of a facility or program variable in a previous cycle. As shown in FIG. 6, the graphical user interface in accordance with this invention displays a recurring cycle with vertical bars on both sides of the cycle column. If the recurring cycle is a "Wait for Condition" type of cycle, the following cycle will have a small diamond at the top of the column just below the cycle number area. In a "Wait for Condition" type of recurring cycle, no cycles may be inserted between the two cycle columns and deletion of the recurring cycle will remove both cycles from the timing diagram.

Referring again to FIG. 2, the value of every facility for every cycle in the timing diagram is specified in the value area. The values specified are the values that will be given on the input facility and checked on the output facility during the simulation run. The values can be specified in several different ways. The values may be specified by a constant number, another facility or program variable, basic arithmetic and Boolean operations, a built-in function, or another function specific to the logic operation.

Constant values may be entered in decimal, hexadecimal or binary. Facility values or variable values can be entered in the edit cycle value window by typing in the name of the facility or variable selected to express the desired value. Both arithmetic operators and Boolean equations and equivalents operators can be entered as values in the cycle edit window. The following tables, Tables I and II, illustrate respectively arithmetic operators and equivalents Boolean operators.

TABLE 1

| Arithmetic Operators | | |
|---|---|---|
| Operator | Function | Example Usage |
| + | Addition | fac_name(0:2)+1 |
| − | Subtraction | fac_name (0:2)-another_fac (2) |
| * | Multiplication | 2*fac_name(0:2) |
| / | Division | fac_name(0:2)/2 |
| ( ) | Order of Execution | (fac_name(0:2)*2)+1 |

TABLE 1-continued

Arithmetic Operators

| Operator | Function | Example Usage |
|---|---|---|
| \|\| | Concatenation | fac__name(0:2)\|\|other__fac(3:4) |
| & | Bit And | fac__name(0:2)&'101'X |
| \| | Bit Or | fac__name(0:2)\|other__fac(0:2) |
| ¬ | One's complement (Use Shift-6 on USA keyboards) | ¬fac__name(0:2) |
| && | Exclusive Or | fac__name(0:2)&&other__fac(1:3) |

TABLE 2

Equivalence Operators

| Operator | Function | Example Usage |
|---|---|---|
| = | Equals | fac__name (0:2) ='010'B |
| ¬= | Not Equal | fac__name (0:2) ¬='010'B |
| >= | Greater than or Equal | fac__name (0:2) >=1 |
| <= | Less than or Equal | fac__name (0:2) <='3'X |
| < | Less than | Fac__name (0:2) <4 |
| > | Greater than | fac__name (0:2) >other_fac (2:4) |

References to facilities and program variables in the cycle edit window specify a bit range, using a parenthesis and colon notation for bit ranges. A don't care function, represented by an X, disables checking for an output value or results in not driving an input value.

Each timing diagram has a limiting condition and a limitor probability that controls the initiation of the sequences. The timing diagram limitor describes the condition or conditions that must be true for a timing diagram sequence to be initiated. Each timing diagram has its own limitor. There are three different limiting types used to describe the limitor condition. A conditional limitor type uses an equivalents statement (i.e. evaluates to "true" or "false"). A delay limitor type specifies a cycle delay count and prevents the timing diagram sequence from reinitiating until the clock cycle count has expired. A maximum limitor type specifies the number of outstanding (pipelined) instances of this timing diagram that are allowed at any given time. When this limit is reached, new instances of the timing diagram will not be allowed until outstanding instances are completed. The three limitor types can be used in combination to specify a given limiting condition.

Figure 7:
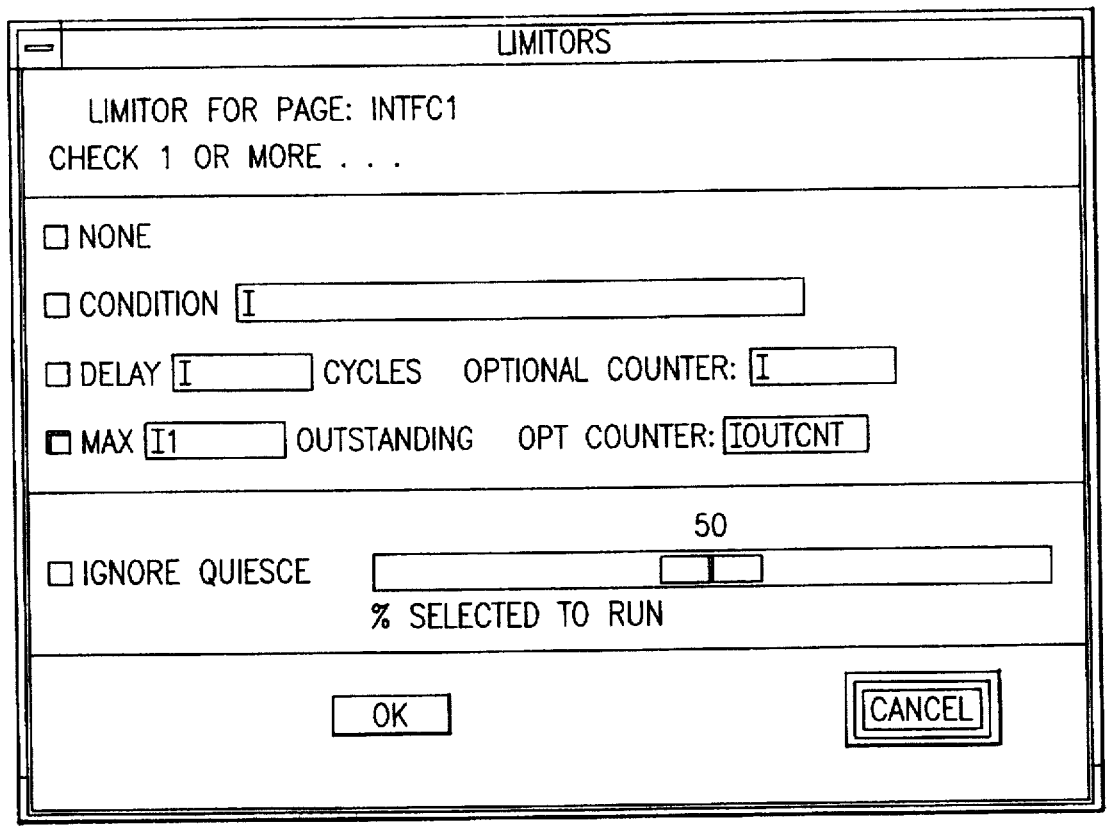
FIG. 7 illustrates a limiting condition graphical user interface screen.

Each timing diagram limitor has a limitor probability that allows a user to adjust the probability of a timing diagram instance being initiated during a simulation. FIG. 7 shows limiting condition input user interface screen. The probability is controlled by the slide bar; if the probability is set to zero, the timing diagram sequence will never be initiated and if the probability is set to 100 the sequence will be initiated every time the limitor conditions are evaluated as true.

In the use of the timing diagram interface in accordance with the teachings of this invention, it should be noted that there are two basic timing diagram coding styles. In action oriented timing diagrams complete an entire interaction within one timing diagram. The timing diagram starts an interaction, supplies all of the stimulus, and checks the responses throughout the sequence. An action oriented timing diagram is generally appropriate for simpler interface protocols. An interface oriented timing diagram has each timing diagram emulate a specific entity and not the entire surrounding logic. Using this approach, one timing diagram stimulus often causes another timing diagram to initiate. In this case, the second timing diagram's limitor is used to kick off the instance based on outputs caused by the first timing diagram's stimulus.

Figure 8:
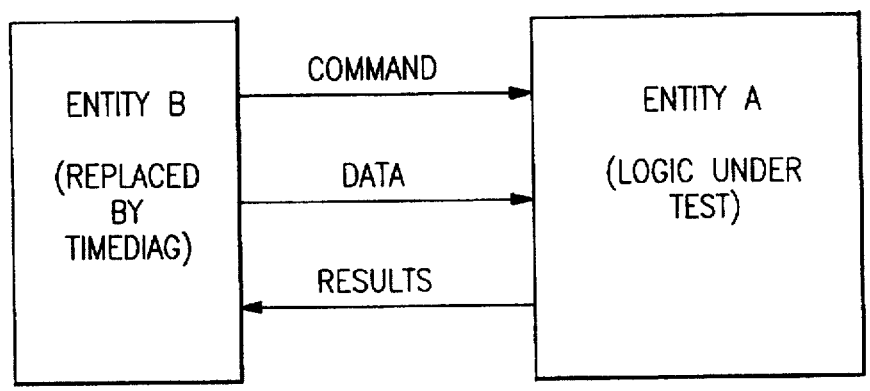
FIG. 8 is a block diagram of a simple action example of a logic entity under test.
Figure 9:
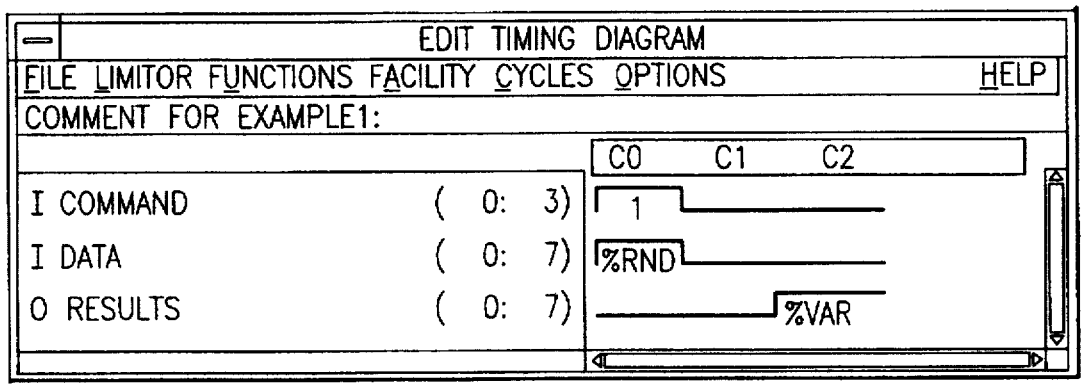
FIG. 9 illustrates a timing diagram in accordance with the invention to model the example of FIG. 8.

The operation of the invention can be illustrated by way of the following examples. FIG. 8 shows a simple action example in which entity A is the logic being tested. Entity B drives the lines to entity A and gets results back. In this example, entity A, the target of the simulation, is driven by entity B and when entity A finishes processing the command and data, it sends the results back to entity B. This example is easily modeled using the interfaces thus far described. The timing diagram of FIG. 2 inputted to model the example of FIG. 8 is shown in FIG. 9. FIG. 9 shows the interface lines to and from entity A and the timing associated with the facilities. Although simple, this timing diagram provides all of the needed inputs to model the interface interactions between entity A and entity B. The "I" character that precedes the command and data facilities states that those facilities are inputs while the "O" before the results indicates an output facility. The bit ranges for all three facilities are specified. The timing diagram of FIG. 9 also inputs that it takes three cycles to complete the action; at cycle C0 the command and data are driven on the inputs to entity A, and the results are returned two cycles later.

Figure 10:
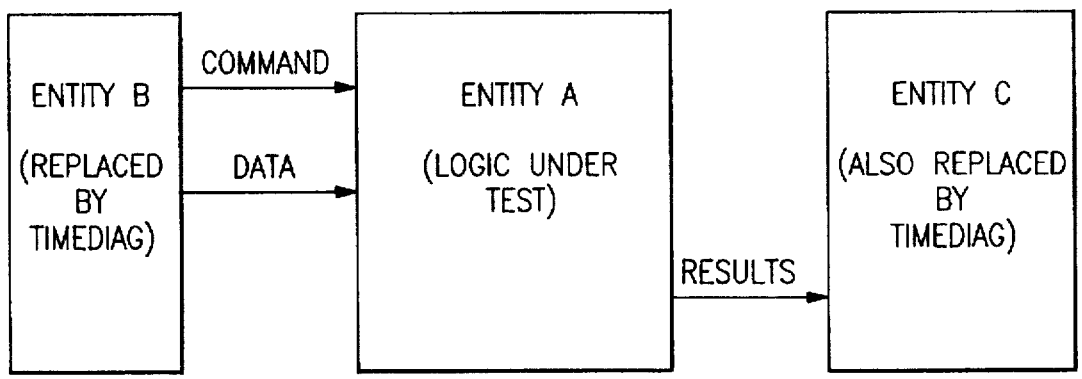
FIG. 10 is another example of a logic entity under test.

FIG. 10 shows a second, simple action oriented interface example. Here, the same logic under test, entity A of FIG. 8, sends each output to a third entity, entity C. For this example, no changes are needed to the model interface shown in FIG. 9. Here it should be noted that a full understanding of how the inputs and outputs relate to each other is required to accurately describe the interfaces. The specifics of the surrounding logic are not important to the model.

Figure 11:
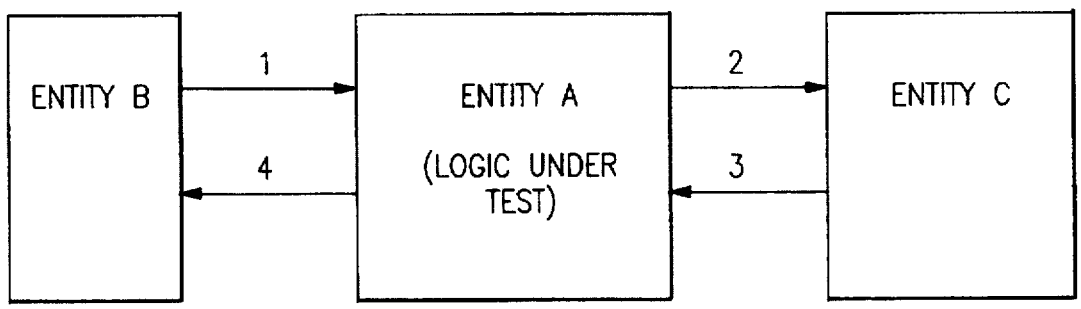
FIG. 11 is still another example of a logic entity under test.
Figures 12, 13:
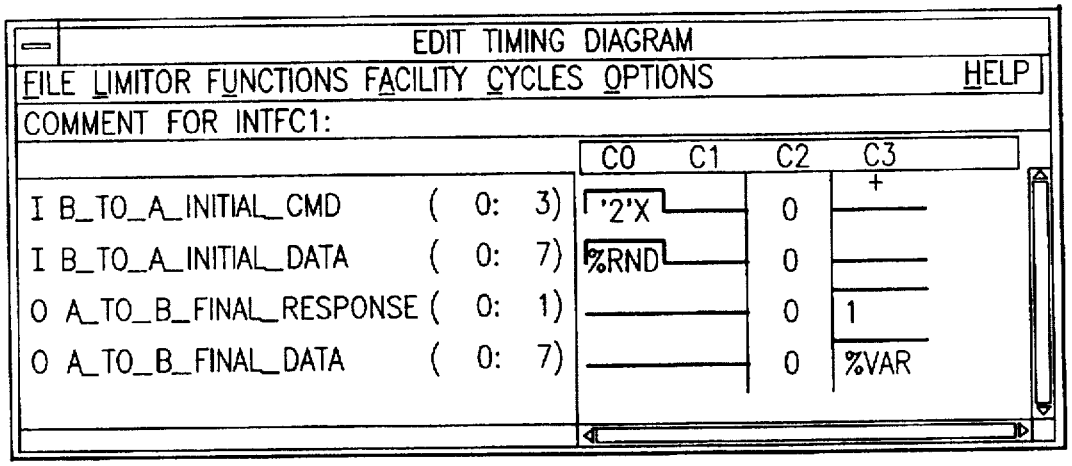
FIG. 12 is one timing diagram to model the example of FIG. 11.
FIG. 13 illustrates a limitor interface for the timing diagram of FIG. 12.

FIG. 11 shows a complex interface oriented example. Here, entity A is the logic being tested. Entity B initiates the sequence, and entity C responds to the stimulus from entity A. In this interface oriented model, each interface is represented by a separate timing diagram. In this example, the interfaces between entity A and B and entity A and C would both be coded in different timing diagrams. The first timing diagram might include sequences 1 and 4 from FIG. 11. This timing diagram would initiate the entire sequence, wait for some amount of time, then check the resulting outputs at the end. Initiation of this timing diagram would be random. The second timing diagram would include sequences 2 and 3 from FIG. 11. This timing diagram would be initiated by the events of interface action 2. The timing diagram would check for correct data in the interface action 2, and respond to the action with interface action 3. This response would then cause the logic in entity A to complete the entire sequence with interface action 4, thereby completing the first timing diagram. FIG. 12 illustrates the first timing diagram interface, and FIG. 13 illustrates the limitor interface for the timing diagram of FIG. 12. Here, the limitor prevents the sequence from occurring whenever the sequence is already outstanding. That is, there will be no pipelining of the sequence because the "Max" outstanding counter is set to 1. The probability slide bar is set to 50 percent so that the overall outcome is that the sequence will be initiated about 50 percent of the time that the sequence is not already active.

Cycles C2 and C3 of the timing diagram in FIG. 12 represent a recurring cycle where the entity D is waiting for a response from entity A. The recurring cycle definition for this timing diagram is shown in FIG. 13. This recurring cycle definition states that the timing diagram in FIG. 11 should loop until "A__2__B__final__response(0:1)¬=0" during cycle 2. While waiting, the inputs in the timing diagram will be driven to the values in cycle C2, and the outputs will be checked against the values in cycle C2. Cycle C3 represents the cycle when A__2__B__final__response(0:1) is not zero (i.e. the ending condition). The hang count, which has been set to 100, puts a time out condition on the limitor. If the end condition is not met within 100 cycles a hang error would be flagged.

Figure 14:
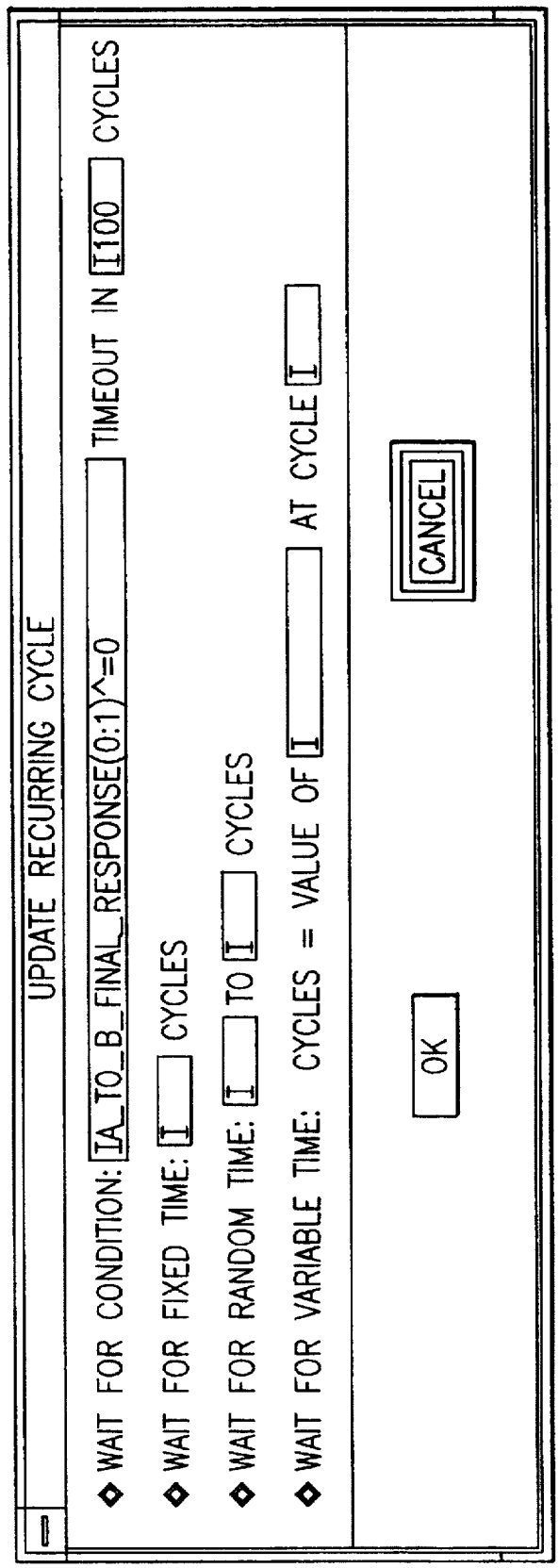
FIG. 14 is a recurring cycle input interface for the diagram of FIG. 12.
Figure 15:
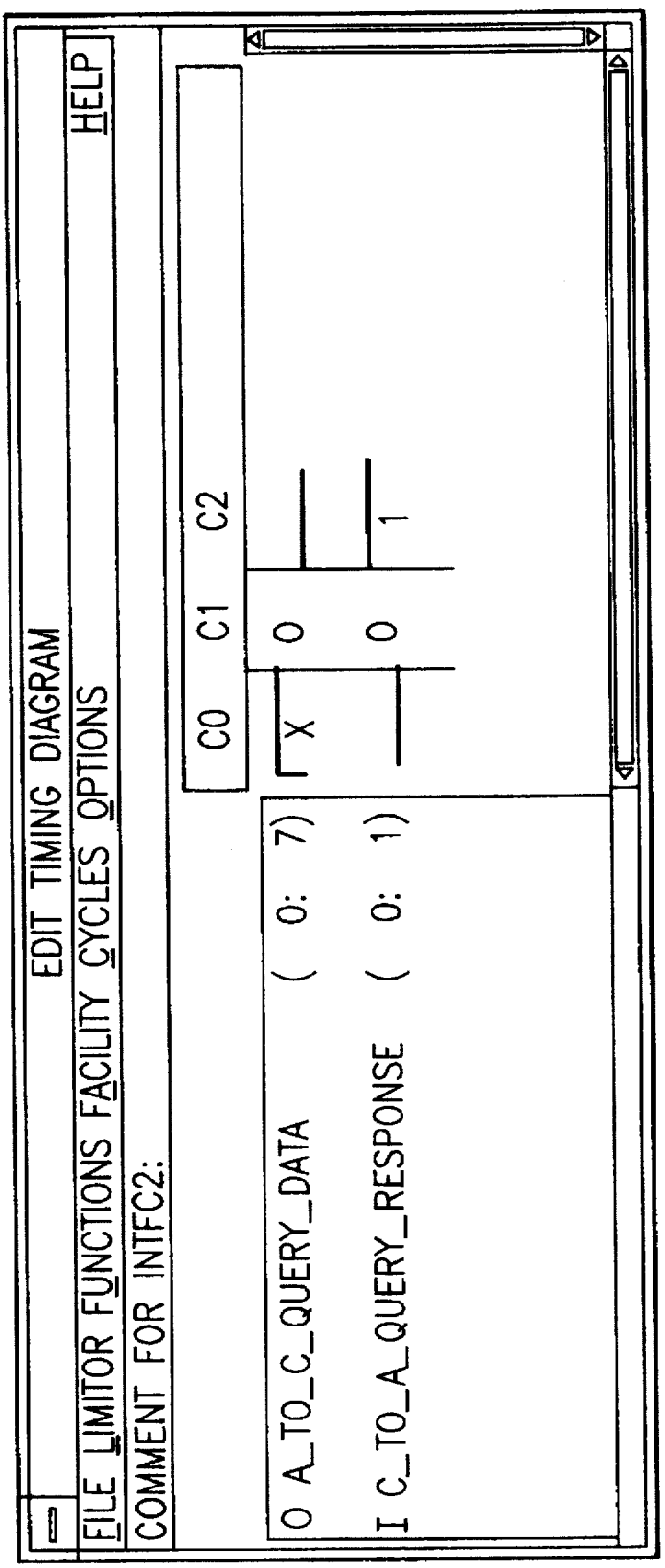
FIG. 15 is another timing diagram for the example of FIG. 11.
Figure 16:
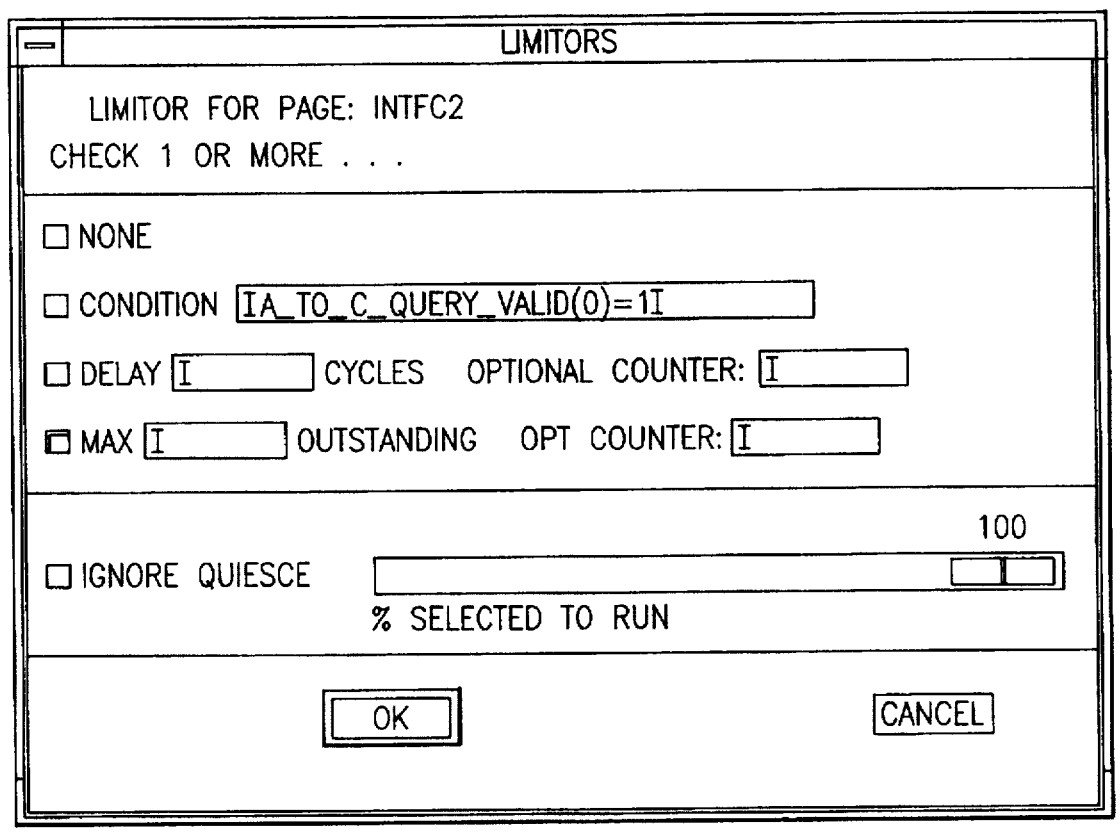
FIG. 16 illustrates a graphical user interface screen to input limitors to the timing diagram of FIG. 15.

FIG. 15 represents the timing diagram for the interface between entity A and entity C. This timing diagram shows query data and a query response. The query data comes from entity A as a result of the timing diagram 1 being initiated. The query response emulates what entity C might send back entity A as a result of the query. FIG. 15 shows a limitor for the timing diagram in FIG. 14.

The limitor causes timing diagram 2 to act as a "slave" to entity A. The limiting condition states that this timing diagram can only be initiated when A__to__C__query__valid (0) is on. The "ignore quiesce" button is also set to insure that this timing diagram is run even if GENRAND has started to quiesce the run.

A recurring cycle has been put in timing diagram 2 in order to add a random delay between the query data and the query response.

In this case, the "Wait for Random Time" button was used, and low-bound and high-bound values were filled in the proper fields. After the randomly chosen waiting period, the timing diagram will continue with cycle C2.

If all goes well in the logic of Entity A, the query response from Entity C will evoke a response from Entity A back to Entity B. This response will trigger the end condition in the recurring cycle of timing diagram, allowing the timing diagram to complete, ending the whole sequence. After that, the limitor "Max" condition on timing diagram would allow GENRAND to initiate a new instance of the sequence.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for inputting parameters via a graphical user interface into a data base in order to build a testcase for a computer simulation of a logic design, comprising the steps of:
   - inputting facility parameters of said logic design via a graphical user facility interface screen;
   - inputting cycle values for each facility via a graphical user cycle interface screen;
   - inputting recurring cycles via a graphical user recurring cycle interface screen;
   - inputting limiting conditions and a limitor probability for a timing diagram via a graphical user limitor interface screen;
   - generating an interface protocol to said computer simulation of a logic design via a timing diagram formatted graphical user interface screen, which timing diagram formatted graphical user interface screen lists facilities in a vertical column and cycle values for each facility in a horizontal row from said inputting steps and corresponding cycle values for each facility aligned in vertical columns.

2. A method for inputting parameters for a logic design as in claim 1 wherein said facility interface screen specifies inputs for an input/output descriptor, a facility name, and a facility bit range.

3. A method for inputting parameters for a logic design as in claim 1 wherein said cycle interface screen specifies for each selected cycle a cycle value for each facility.

4. A method for inputting parameters for a logic design as in claim 1 wherein said recurring cycle interface screen specifies inputs for end conditions for each recurring cycle.

5. A method for inputting parameters for a logic design as in claim 1 wherein said limitor cycle interface screen respectively specifies conditions for invocation of the cycle in a testcase and a probability that it will be invoked via a user interface screen.

6. A method for inputting parameters for a logic design as in claim 2 wherein said cycle interface screen specifies for each selected cycle a cycle value for each facility.

7. A method for inputting parameters for a logic design as in claim 2 wherein said recurring cycle interface screen specifies inputs for end conditions for each recurring cycle.

8. A method for inputting parameters for a logic design as in claim 2 via a user interface screen wherein said limitor cycle interface screen respectively specifies conditions for invocation of the cycle in a testcase and a probability that it will be invoked.

9. A method for inputting parameters via a graphical user interface into a data base in order to build a testcase for a computer simulation of a logic design, comprising the steps of:
   - inputting facility parameters of said logic design via a graphical user interface screen that specifies inputs for an input/output descriptor, a facility name, and a facility bit range;
   - inputting cycle values for each facility via a graphical user interface screen that specifies for each selected cycle a cycle value for each facility;
   - inputting recurring cycles via a graphical user interface screen that specifies inputs for end conditions for each recurring cycle;
   - inputting limiting conditions and a limitor probability for a timing diagram that respectively defines conditions for invocation of the timing diagram in a testcase and a probability that it will be invoked via a user interface screen;
   - generating an interface protocol to said computer simulation of a logic design via a timing diagram formatted graphical user interface screen from said inputting steps, which timing diagram graphical user interface screen lists facilities in a vertical column and cycle values for each facility in a horizontal row from said inputting steps and corresponding cycle values for each facility aligned in vertical columns.

10. A method for inputting parameters for a logic design as in claim 4 wherein said end condition includes a wait for a condition, a loop for a specific number of cycles, a loop for a bounded random number of cycles, and a loop for a variable number of cycles.

11. A method for inputting parameters for a logic design as in claim 10 wherein said timing diagram graphical user interface screen identifies a recurring loop cycle with vertical bars on either side of a vertical column in which said recurring loop cycle occurs.

12. A method for inputting parameters for a logic design as in claim 9 wherein said end condition includes a wait for a condition, a loop for a specific number of cycles, a loop for a bounded random number of cycles, and a loop for a variable number of cycles.

13. A method for inputting parameters for a logic design as in claim 12 wherein said timing diagram graphical user interface screen identifies a recurring loop cycle with vertical bars on either side of a vertical column in which said recurring loop cycle occurs.

* * * * *